US009608741B2

(12) United States Patent
Xue et al.

(10) Patent No.: US 9,608,741 B2
(45) Date of Patent: Mar. 28, 2017

(54) ELECTRONIC APPARATUS FOR USE IN A COMMUNICATION SYSTEM

(71) Applicant: City University of Hong Kong, Kowloon (HK)

(72) Inventors: Quan Xue, Kowloon (HK); Wai Lun Lam, Kowloon (HK); Kam Man Shum, Kowloon (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 14/843,342

(22) Filed: Sep. 2, 2015

(65) Prior Publication Data

US 2017/0063472 A1 Mar. 2, 2017

(51) Int. Cl.
*H04B 15/00* (2006.01)
(52) U.S. Cl.
CPC .................... *H04B 15/00* (2013.01)
(58) Field of Classification Search
CPC ..................................... H04B 15/00
USPC ....................................... 375/296
See application file for complete search history.

(56) References Cited

U.S. PATENT DOCUMENTS

| 5,812,941 A * | 9/1998 | Cho ................ H03G 3/3042 |
| | | 455/115.3 |
| 2015/0357999 A1* | 12/2015 | Soe ...................... G05F 3/16 |
| | | 343/850 |

OTHER PUBLICATIONS

Saito, T., Hidaka, N.; Ono, K.; Ohashi, Y.; Shimura, T., "60-GHz MMIC imagerejection downconverter using InGaP/InGaAs HEMT," Gallium Arsenide Integrated Circuit (GaAs IC) Symposium, 1995. Technical Digest 1995., 17thAnnual IEEE, pp. 222,225, Oct. 29, 1995-Nov. 1, 1995.
Weaver, D.K., "A Third Method of Generation and Detection of Single-Sideband Signals," Proceedings of the IRE , vol. 44, No. 12, pp. 1703,1705, Dec. 1956doi: 10.1109/JRPROC.1956.275061.

* cited by examiner

*Primary Examiner* — Michael Neff
(74) *Attorney, Agent, or Firm* — Renner Kenner Greive Bobak Taylor & Weber (57) ABSTRACT

A system and method of an electronic apparatus for use in a communication system includes a switching module arranged to combine a plurality of input signals received by a plurality of input ports in connection with the switching module to define a combined input signal having a plurality of frequency components; and a loading module arranged to receive the combined input signal from the switching module and to individually separate each of the plurality of frequency components of the combined input signal by processing the combined input signal with a plurality of resonating networks, each arranged to resonate at a resonance frequency associated with each of the plurality of frequency components of the combined input signals.

23 Claims, 9 Drawing Sheets

ELECTRONIC APPARATUS FOR USE IN A COMMUNICATION SYSTEM

TECHNICAL FIELD

The present invention relates to an electronic apparatus for use in a communication system, although not exclusively, to a communication signal mixer.

BACKGROUND

Communication systems play an important role in information and communication technology. Information may be modulated to different forms of electrical signals which may be further transmitted using different types of communication systems.

In a radio signal communication system, information may be modulated to radio signal in different frequencies suitable for transmitting in wired or wireless signal communication systems in certain frequency bands. Signal mixer may be used to transform the signals into radio frequencies which are suitable to be transmitted using radio transmitter. Typically, the transformation involves a conversion of frequencies of the information signal(s) which produce a new electrical signal having a plurality of frequency components, in which only one or a few of the plurality of frequency components may be useful while the others contributes to noise interfering the useful signal or other signal in other frequency bands. It is desirable to suppress these noise signal from being transmitted.

SUMMARY OF THE INVENTION

In accordance with a first aspect of the present invention, there is provided an electronic apparatus for use in a communication system comprising: a switching module arranged to combine a plurality of input signals received by a plurality of input ports in connection with the switching module to define a combined input signal having a plurality of frequency components; and a loading module arranged to receive the combined input signal from the switching module and to individually separate each of the plurality of frequency components of the combined input signal by processing the combined input signal with a plurality of resonating networks, each arranged to resonate at a resonance frequency associated with each of the plurality of frequency components of the combined input signals.

In an embodiment of the first aspect, the loading module is arranged to output an output signal having a desired frequency component separated from the plurality of frequency components separated of the combined input signal to an output port in connection with the loading module.

In an embodiment of the first aspect, the plurality of frequency components further includes an image frequency component.

In an embodiment of the first aspect, the loading module is further arranged to suppress the image frequency component from reaching the output port.

In an embodiment of the first aspect, the plurality of resonating networks includes an inductor-capacitor network.

In an embodiment of the first aspect, the plurality of resonating networks comprise a first resonator and a second resonator.

In an embodiment of the first aspect, the first resonator comprises a first inductor connected to a first capacitor, and the second resonator includes a second inductor connected to a second capacitor.

In an embodiment of the first aspect, the first resonator is arranged to pass the image frequency component to a ground.

In an embodiment of the first aspect, the first resonator is arranged to resonate at a first resonance frequency associated with the image frequency component.

In an embodiment of the first aspect, the first resonance frequency is represented by $$\omega_{stop}^2 = \frac{1}{L_1 C_1},$$

wherein $\omega_{stop}$ is the first resonance frequency, $L_1$ is a first inductance value of the first inductor, and $C_1$ is a first capacitance value of the first capacitor.

In an embodiment of the first aspect, the first inductor and the first capacitor are connected in series.

In an embodiment of the first aspect, the second resonator is arranged to pass the desired frequency component to the output port.

In an embodiment of the first aspect, the second resonator is arranged to resonate at a second resonance frequency associated with the desired frequency component.

In an embodiment of the first aspect, the second resonance frequency is represented by $$\omega_{pass}^2 = \frac{(C_1 + C_2)L_2 + L_1 C_1 - 1}{L_1 L_2 C_1 C_2},$$

wherein $\omega_{pass}$ is the second resonance frequency, $L_1$ is a first inductance value of the first inductor, $C_1$ is a first capacitance value of the first capacitor, $L_2$ is a second inductance value of the second inductor, and $C_2$ is a second capacitance value of the second capacitor.

In an embodiment of the first aspect, the second inductor and the second capacitor are connected in parallel.

In an embodiment of the first aspect, the loading module is a transformer based load.

In an embodiment of the first aspect, the first inductor is approximate to the second inductor.

In an embodiment of the first aspect, the first inductor and the second inductor are magnetically coupled.

In an embodiment of the first aspect, the first capacitor and the second capacitor are controllable capacitors.

In an embodiment of the first aspect, the controllable capacitors are digitally controllable.

In an embodiment of the first aspect, the controllable capacitors are arranged to alter the resonance frequencies of the loading module such that the electronic apparatus is arranged to operate within a bandwidth in a frequency domain.

In an embodiment of the first aspect, further comprising: an input buffer connected to at least one of the plurality of input ports; and an output buffer connected to the output port.

In an embodiment of the first aspect, the input buffer is arranged to perform a low to high impedance transformation to at least one of the plurality of input signals received at the plurality of input ports.

In an embodiment of the first aspect, the output buffer is arranged to perform a high to low impedance transformation to the output signal.

In an embodiment of the first aspect, the plurality of input signals include at least one of an intermediate frequency signal and a local oscillator signal; and wherein the output signal includes a radio frequency signal.

In an embodiment of the first aspect, the electronic apparatus is a communication signal mixer.

In an embodiment of the first aspect, the switching module and/or the loading module is implemented with integrated-circuit process.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

The inventors have, through their own research, trials and experiments, devised that in a transceiver front-end, mixer plays a very important role to modulate the signal IF (intermediate frequency) with LO (local oscillator) to RF (radio frequency). However, instead of having $\omega_{desired}$ (LO+IF) as the desired output, the by-product which is the subtraction of the two inputs $\omega_{image}$ (LO−IF) known as "IMAGE" will also be generated. This image will not only waste the precious spectrum but also disturb other channels' users.

Most of the front-end structure will have image problem which deteriorates the system performance and wastes precious spectrum. For example, the Hartley image rejection mixer has different problems especially in the millimeter-wave band and high-speed communication. Firstly, the required 0° and 90° phase shifters are extremely expensive especially in millimeter-wave band. Secondly, the amplitudes between the output of the 0° and 90° phase shifters are hard to be equal. Also, wideband phase shifter for high data rate makes this conventional mixer infeasible. Even ignoring the cost and difficulties, this kind of structure can only provide less than 20 dB image rejection in literatures or commercial products.

To solve this problem, transceiver with zero-IF structure may be implemented. However, its well-known DC offset and stringent $2^{nd}$ harmonic suppression requirement deteriorate the system performance significantly. As such, the sliding-IF is the most favourable choice if the image problem is ignored. Alternatively, suppressing image may be achieved by incorporating the conventional Hartley mixer incorporating 0° and 90° phase shifters. However, as the operating frequency rises, the phase and amplitude imbalance dominate and worsen the image rejection of the conventional mixer. Moreover, high data rate communication necessitates high frequency sliding-IF structure which makes the rejection ratio even worse.

Figure 1:
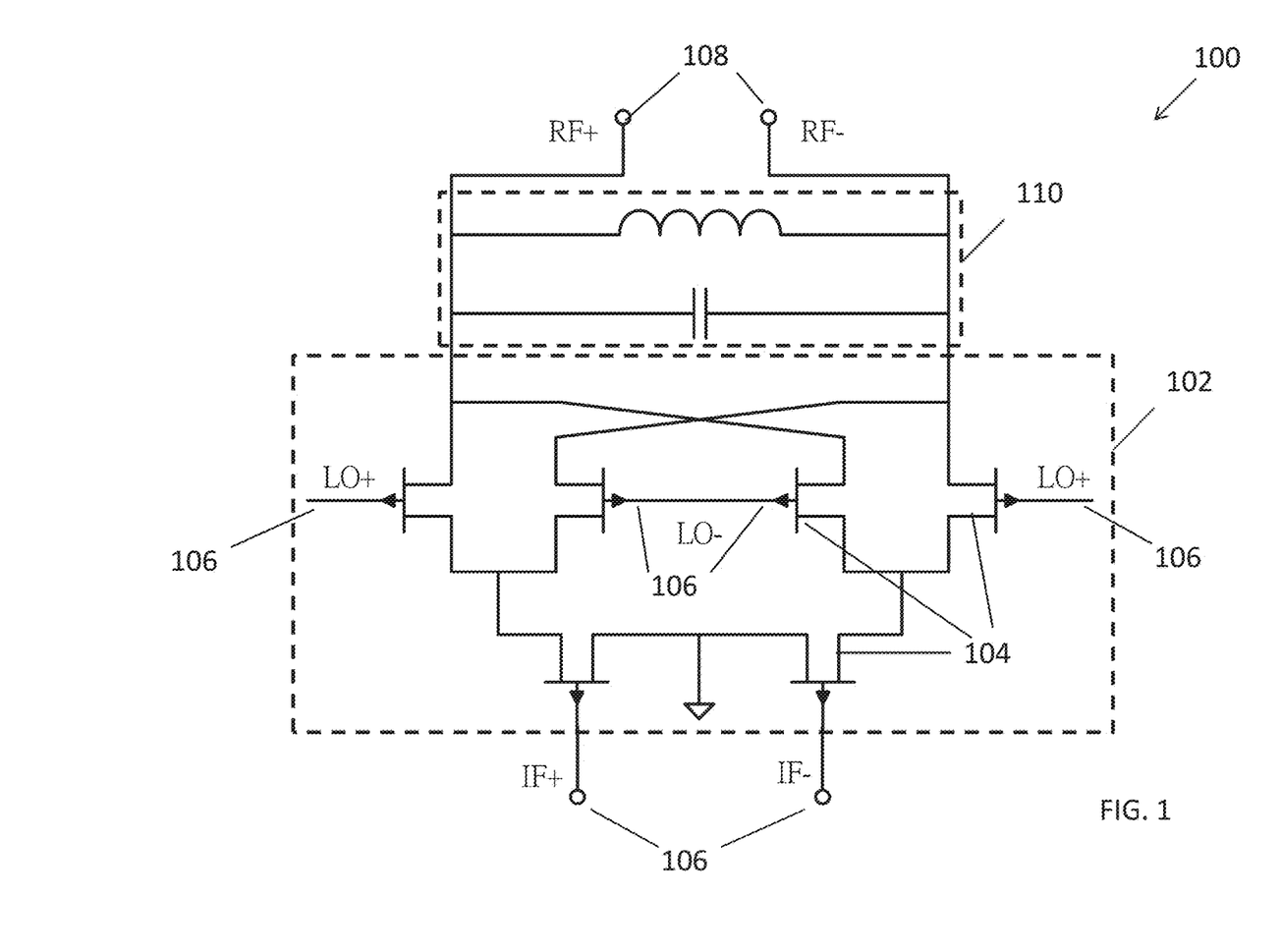
FIG. 1 is a schematic illustration of an example of a mixer having an inductive load.
Figure 2:
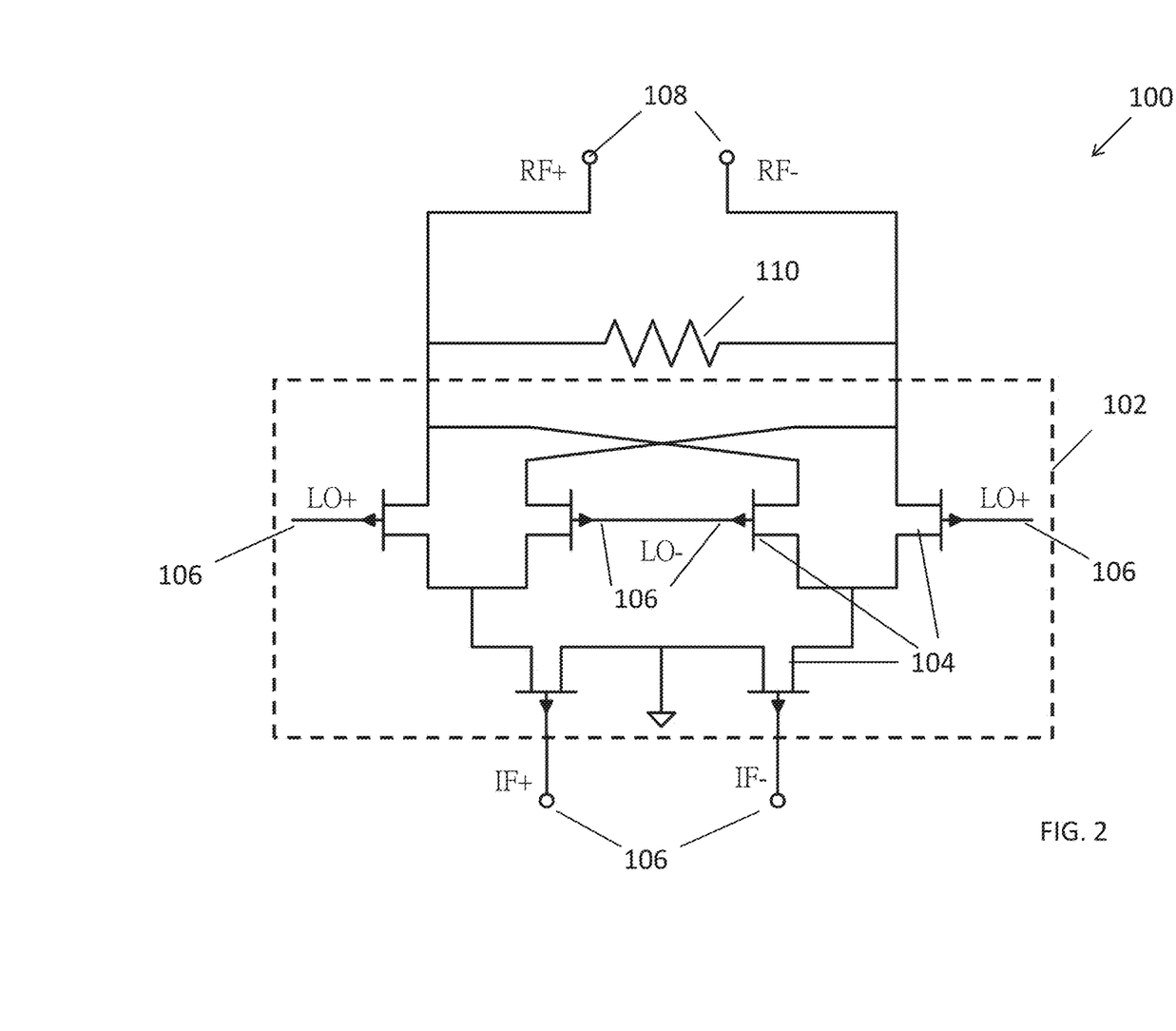
FIG. 2 is a schematic illustration of an example of a mixer having a resistive load.

With reference to FIGS. 1 to 2, there is shown an example of a mixer 100 for use in a communication system. The mixer 100 may include a double balanced mixer structure having a mixer core 102 with a plurality of transistors or switches 104 forming a switching network. The switches receives input signals such as LO and IF signals from the input ports 106 and hence perform switching operations in response to these input signals. The IF signal may then be mixed or combined with the LO signal to form a combined signal. The input signals may than be passed to the output port 108 through a suitable load 110 in which the load 110 may be implemented as an inductive load or a resistive load as shown in FIGS. 1 and 2 respectively.

Figure 3:
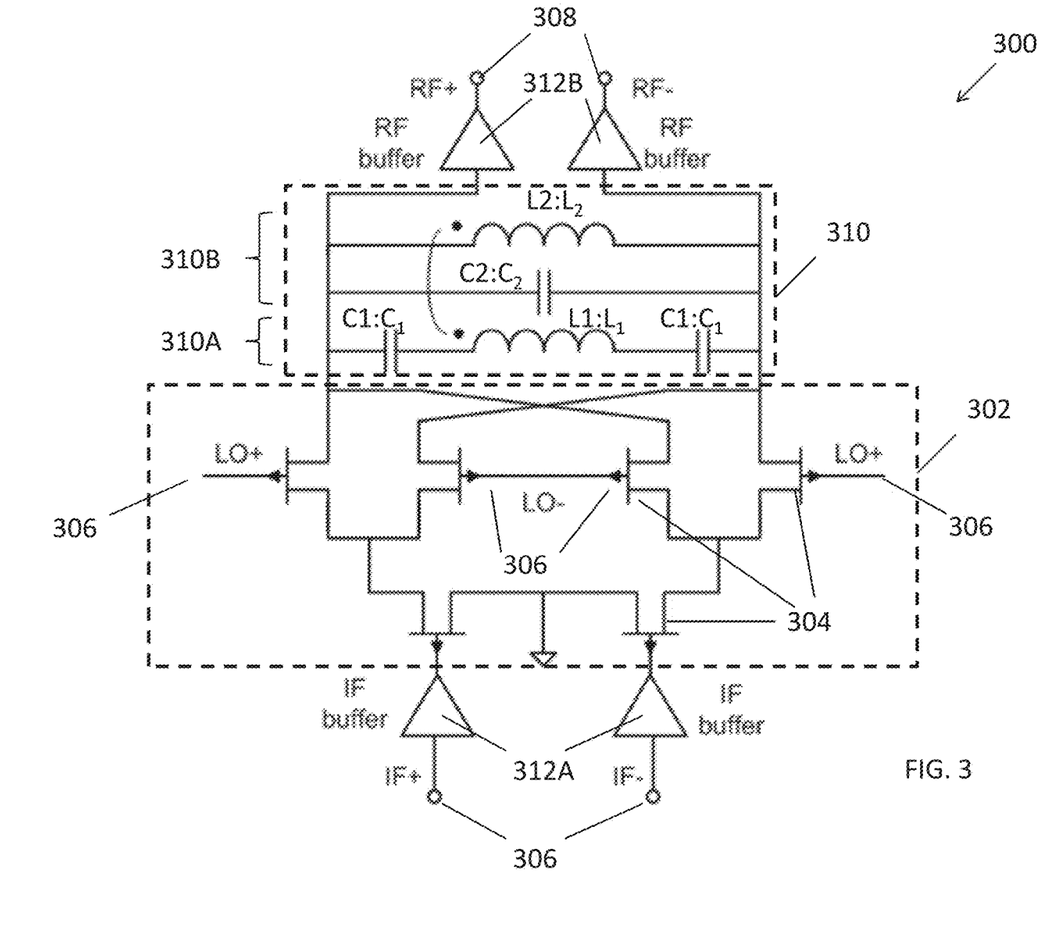
FIG. 3 is a schematic illustration of an electronic apparatus for use in a communication system in accordance with one embodiment of the present invention wherein electronic apparatus comprises a transformer based load.

With reference to FIG. 3, there is shown a preferred embodiment of an electronic apparatus 300 for use in a communication system comprising: a switching module 302 arranged to combine a plurality of input signals received by a plurality of input ports 306 in connection with the switching module 302 to define a combined input signal having a plurality of frequency components; and a loading module 310 arranged to receive the combined input signal from the switching module 302 and to individually separate each of the plurality of frequency components of the combined input signal by processing the combined input signal with a plurality of resonating networks, each arranged to resonate at a resonance frequency associated with each of the plurality of frequency components of the combined input signals.

In this embodiment, the electronic apparatus 300 is a communication signal mixer or a frequency mixer which may be used in a communication system. The mixer 300 is in a double balanced structure so that the input to output signals isolation may be higher. For example, the switching module 302 comprises a plurality (such as four as shown in the figures) of switches 306 or transistors connected to a plurality of input ports 306. In this configuration, an intermediate frequency (IF) signal is mixed or combined with a local oscillator (LO) signal both received at a plurality of input ports 306 connected to the switches 306, and hence a combined input (IF and LO) signal is obtained. Preferably, the switches 306 may be any electronic transistors such as field effect transistors (FET), metal-oxide semiconductor (MOS) transistors, or any other electronic components which may be used as switches as appreciated by a person skilled in the art.

Preferably, the IF signal and the LO signal have different frequencies such that the combined input signal includes at least two different frequency components, such as the sum (LO+IF) and the difference (LO−IF). Based on different applications, the sum (LO+IF) is may be defined as a desired frequency component, and the difference (LO−IF) may be considered as an image frequency component. The desired frequency component may be further passed to the output port 308 as an output signal of the mixer 300. The output signal may then be further transmitted in a communication system as a radio frequency (RF) signal by a signal transmitter or transceiver.

It is desirable that the unwanted image frequency component is suppressed or eliminated from the output signal as this image frequency component may contribute noise or interference to other frequency signal within the same spectrum.

As shown in FIG. 3, the electronic apparatus 300 further comprises a loading module 310 arranged to receive the combined input signal from the switching module 302. In a double balanced mixer, the input ports and the output ports are to be matched since the double balanced structure is termination impedance sensitive. Instead of have a simple inductive load 110 or a resistive load 110 as shown FIGS. 1 and 2, preferably, the loading module 310 includes an inductor-capacitor network having a plurality of inductors and capacitors within the network. Apart from matching the ports, the loading module 310 may be arranged to improve the performance of the mixer 300.

Preferably, the loading module 310 may also be arranged to process the combined input signal so as to individually separate each of the plurality of frequency components of the combined input signal. By separating the different frequency components of the combined input signal, desired frequency components such as the sum (LO+IF) may be selectively passed to the output port 308 as the output signal, whereas the unwanted image frequency component (LO−IF) may be suppressed or directed to other ports such as the ground of the circuit.

In this example, the loading module 310 includes a plurality of resonating networks each arranged to resonate at a resonance frequency associated with each of the plurality of frequency components of the combined input signal so as to separate the different frequency components of the combined input signal. The plurality of network may include an inductor-capacitor network having a plurality of inductors and capacitors, and the inductors and capacitors form one or more resonators such that the resonating network may resonate at different frequencies.

Figure 4:
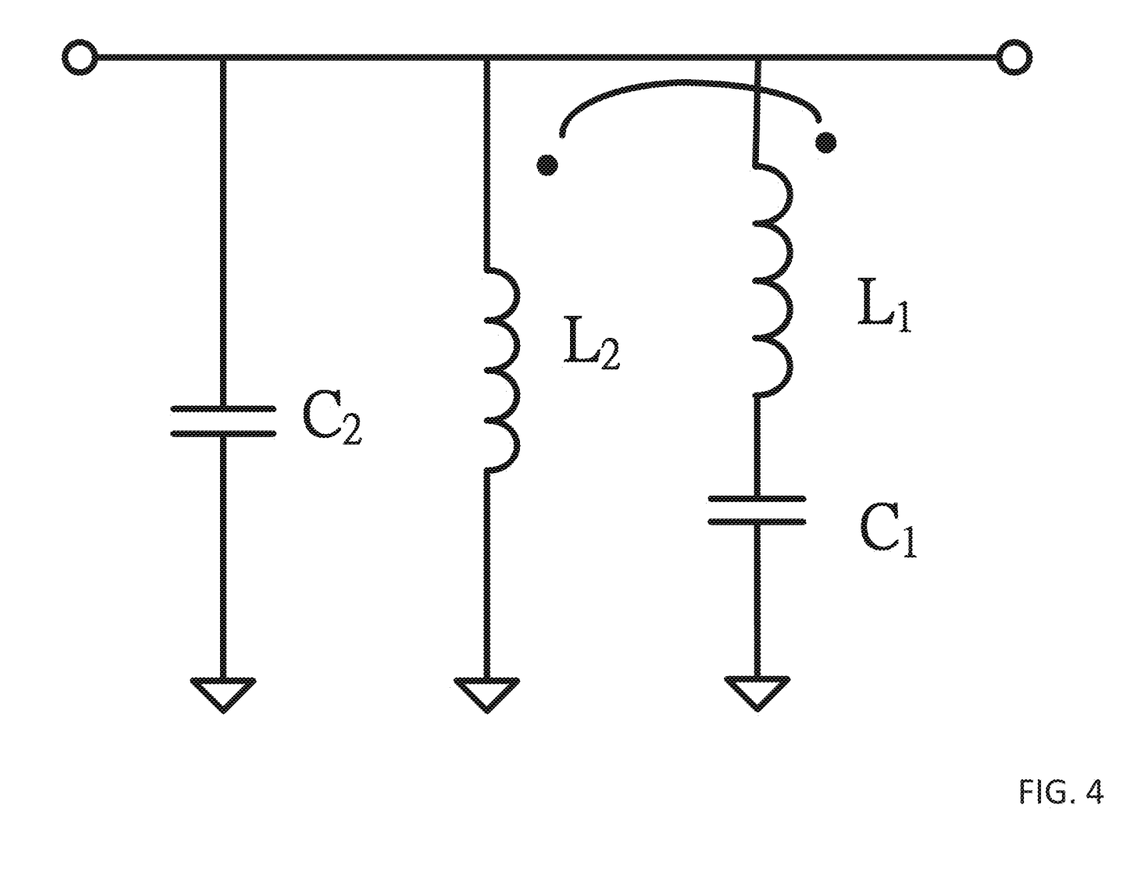
FIG. 4 is a schematic illustration of a half of the loading module of the electronic apparatus of FIG. 1 having a virtual ground.
Figure 5:
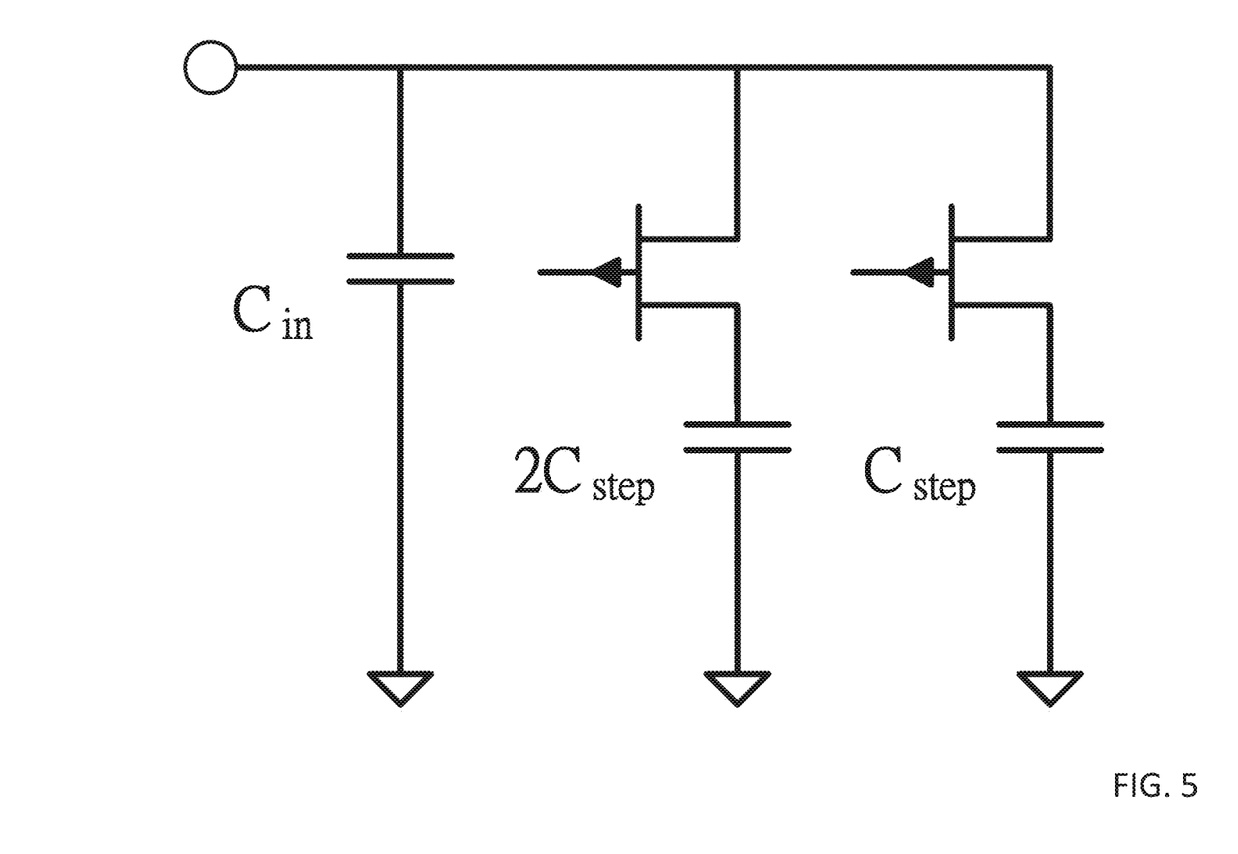
FIG. 5 is a schematic illustration of a digitally-controllable capacitor of the electronic apparatus of FIG. 1.

The resonating networks comprise a first resonator 310A which includes a first inductor L1 and a first capacitor C1. As shown in FIG. 3, the first inductor L1 and the first capacitor C1 are connected in series, and the combination of the first inductor L1 and the first capacitor C1 are connected in parallel between the switching module 302 and the output port 308. Preferably, the first resonator 310A are arranged to resonate at a first resonance frequency which is associated with or equal to the frequency $\omega_{image}$ of the image frequency component. As the mixer 300 is differentially fed, a virtual ground exists in the middle of the load as illustrated in FIG. 4, and the unwanted image frequency component (LO−IF) are effectively by-pass to this virtual ground. Therefore the loading module 310 may suppress the image frequency component from reaching the output port 308.

In this example, the loading module 310 is further arranged to output an output signal having the desired frequency component separated from the combined input signal to an output port 308. Preferably, the resonating networks also comprise a second resonator 310B which includes a second inductor L2 and a second capacitor C2. As shown in FIG. 3, the second inductor L2 and the second capacitor C2 are connected in parallel, and are further connected in parallel between the switching module 302 and the output port 308 (as well as the first resonator 310A). Preferably, the second resonator 310B are arranged to resonate at a second resonance frequency which is associated with or equal to the frequency $\omega_{desired}$ of the desired frequency component. As a result, the desired frequency component is loaded in this shunt resonator 310B formed by the second inductor L2 and the second capacitor C2 such that the desired frequency component is passed to the output port 308 without attenuated. Optionally, the second resonator 310B may be arranged to amplify the desired frequency component when such frequency component is passed to the output port 308.

Preferably, the pass-band and the stop-band resonances may be represented by the following equations:

$$\omega_{stop}^2 = \frac{1}{L_1 C_1} \text{ and} \qquad (1)$$

$$\omega_{pass}^2 = \frac{(C_1 + C_2)L_2 + L_1 C_1 - 1}{L_1 L_2 C_1 C_2} \qquad (2)$$

in which $\omega_{stop}$ is the first resonance frequency, $\omega_{pass}$ is the second resonance frequency, $L_1$ is a first inductance value of the first inductor L1, $C_1$ is a first capacitance value of the first capacitor C1, $L_2$ is a second inductance value of the second inductor L2, and $C_2$ is a second capacitance value of the second capacitor C2.

Since the value of $\omega_{stop}$ and $\omega_{pass}$ depend on the values of the inductors (L1, L2) and/or the capacitors (C1, C2), in some embodiments, the first capacitor C1 and the second capacitor C2 are controllable capacitors. By varying the capacitance values ($C_1$, $C_2$) of the controllable capacitors, the capacitors may alter the resonance frequencies ($\omega_{stop}$, $\omega_{pass}$) of the loading module 310 such that the electronic apparatus 300 may operate within a bandwidth in a frequency domain. Preferably, the controllable capacitors are digitally controllable as shown in FIG. 4. For example, the values of $\omega_{stop}$ and $\omega_{pass}$ as shown earlier in equations (1) and (2) may be varied by introducing different $C_1$ and/or $C_2$ while $L_1$ and $L_2$ may remain fixed.

Advantageously, the controllable capacitors enable the mixer 300 to cover a wide spectrum instead of fixed IF and/or LO signal frequencies such as a 9 GHz bandwidth for WiGig. Alternatively, capacitors with different capacitance values may be implemented such that the electronic apparatus 300 may operate in any desired range of frequency spectrum and/or bandwidth.

In a preferable embodiment, the loading module 310 is a transformer based load. With reference to FIG. 3, the first inductor L1 is approximate to the second inductor L2, such that the two inductors (L1, L2) magnetically couple to each other, and form a transformer where the primary and secondary cores act the two inductors (L1, L2). Preferably, the size of the first and/or the second inductors (L1, L2) are only half of a loading inductor in a conventional inductive load 110, the combination of the first and the second inductors (L1, L2) occupies a same area as the one in a conventional structure 100. The implementation of the electronic apparatus 300 may not introduce additional cost or die area.

Optionally, buffers 312 may be introduced to the input ports 306 and/or the output puts to provide suitable impedance transformation of the input and/or the output signals. For example, the electronic apparatus 300 may comprise an input buffer 312A connected to an input port 306 such as the one arranged to receive an IF signal. The buffer may be arranged to perform a low to high impedance transformation to the IF signal received at the IF input port 306. Similarly or alternatively, the input buffer 312A or an additional input buffer may be placed at the LO input port 306.

In addition, the electronic apparatus 300 may further comprise an output buffer 312B connected to the output port 308. For example, the electronic apparatus 300 may comprise an output buffer 312B connected to an output port 308 such as the one arranged to output an RF signal. The output buffer 312B may be arranged to perform a high to low impedance transformation to the RF signal output at the RF output port 308.

The electronic apparatus 300 including the loading module 310, the switching module 302 and/or the buffers 312 may be implemented with integrated-circuit (IC) process, such that a monolithic IC may be fabricated and packaged to a single IC chip.

These embodiments are advantageous in that the electronic apparatus may suppress the mixing by-product "image" significantly without using phase shifter. As such, the image rejection ratio will not be worsened in high frequency communication. Also, these embodiments will not increase the die size and fabrication cost. By inserting digitally controlled capacitors, the embodiments of the invention can cover a very wide bandwidth. Thus, the electronic apparatus will be very useful in high frequency sliding-IF communication system which has image problem. Moreover, such structure may also be used to further enhance image rejection even the conventional method is used.

In addition, the mixer in accordance with the embodiments of the invention may cover a very wide bandwidth easily only by varying the capacitances in the resonators without the necessity of including a very expensive ultra-wideband phase shifter in the system.

Figure 6:
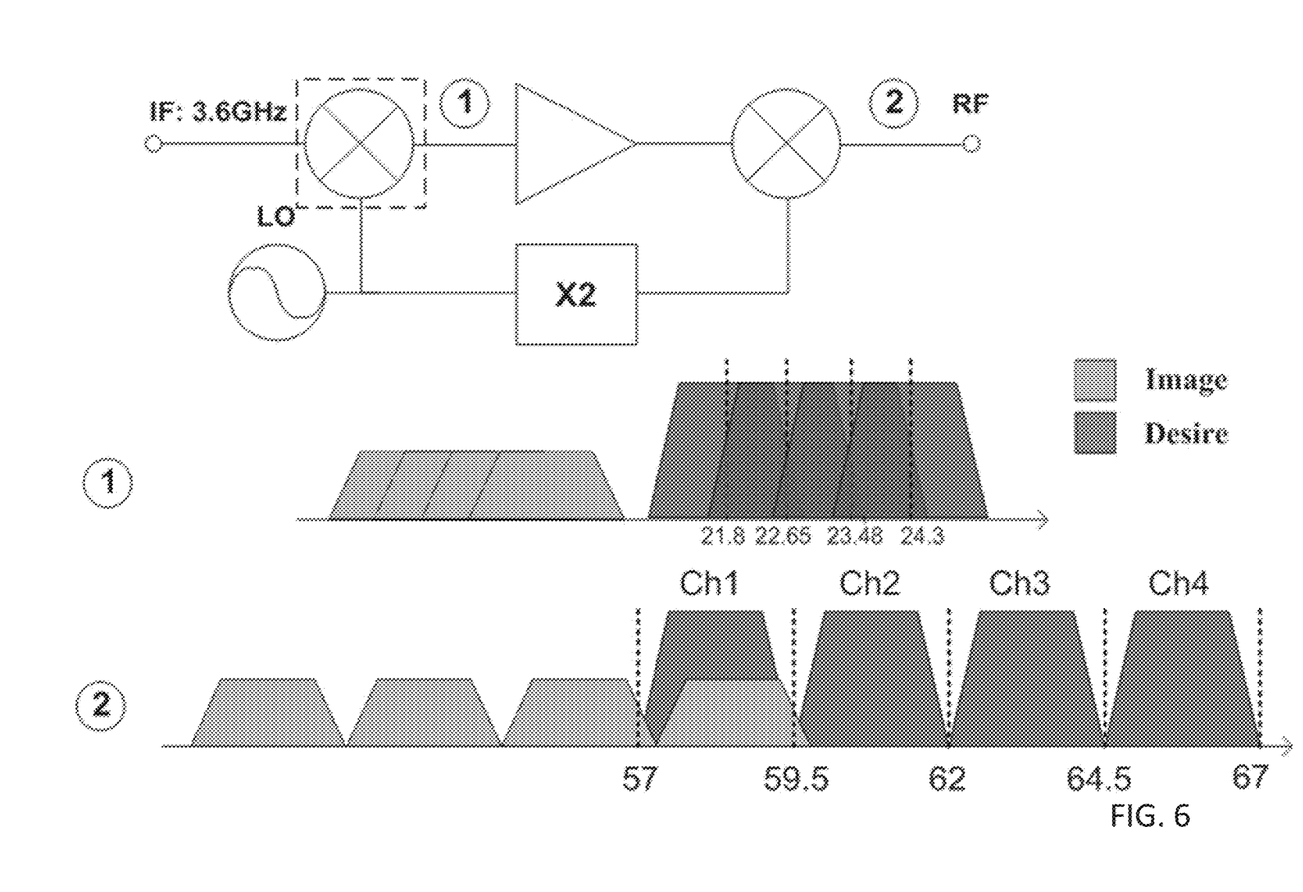
FIG. 6 is an illustration of an electronic apparatus in accordance with one embodiment of the present invention and the responses at two different locations of the electronic apparatus.

With reference to FIG. 6, there is shown an example embodiment of the electronic apparatus. The electronic apparatus is a mixer which is used in the 60 GHz WiGig two-stage communication system designed in CMOS 65 nm fabrication process. The WiGig communication supports four channels and each of them occupies 2.5 GHz bandwidth. In order to cover its spectrum from 57-65 GHz, this mixer may pass the desired and attenuate the image as the frequency bands shown in the Figure.

Figure 7:
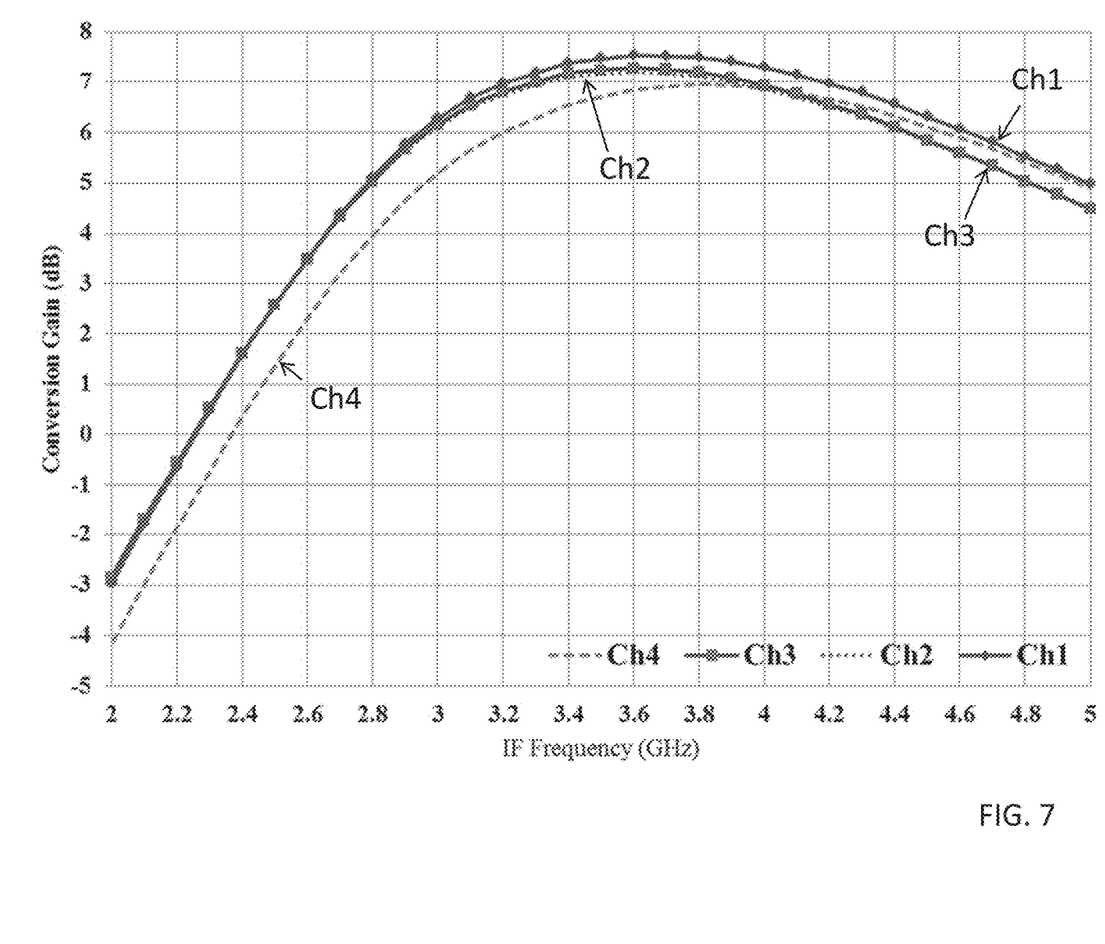
FIG. 7 is a plot showing a simulated conversion gain of the electronic apparatus of FIG. 6.
Figure 8:
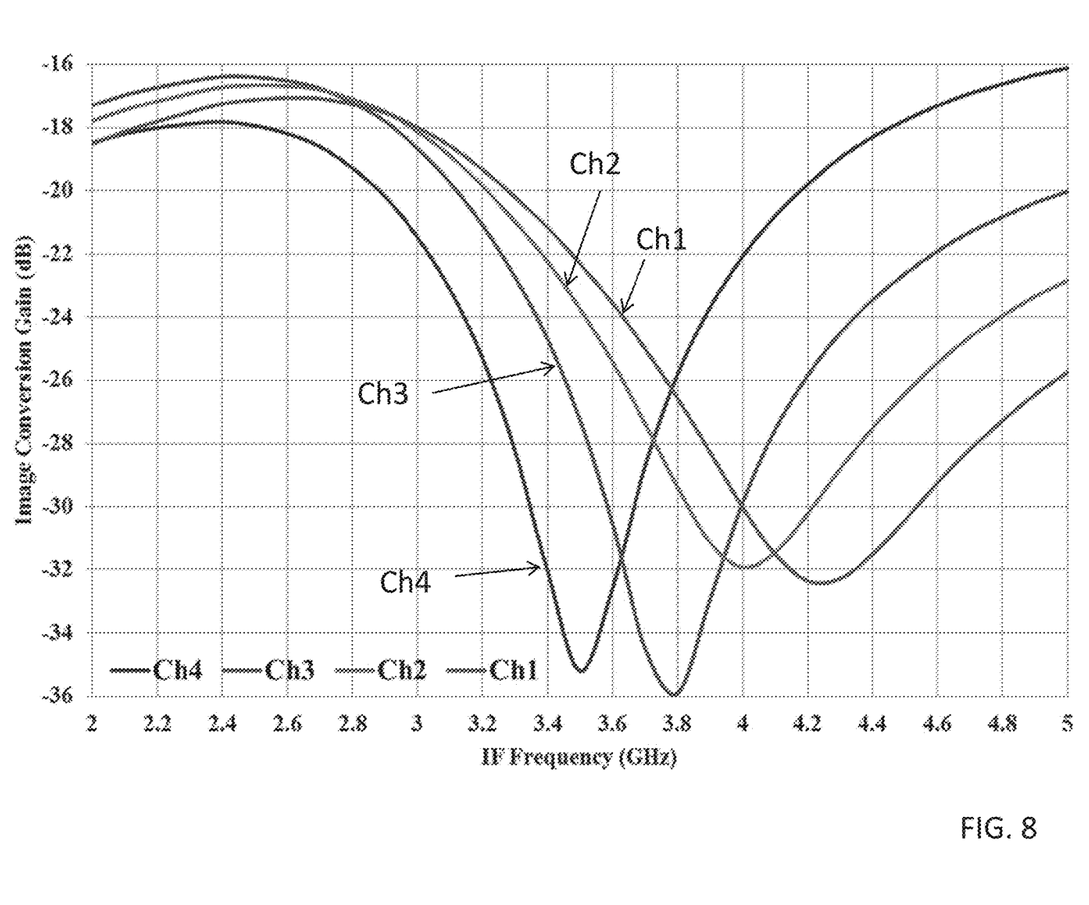
FIG. 8 is a plot showing a conversion loss of the image of in the electronic apparatus of FIG. 6.
Figure 9:
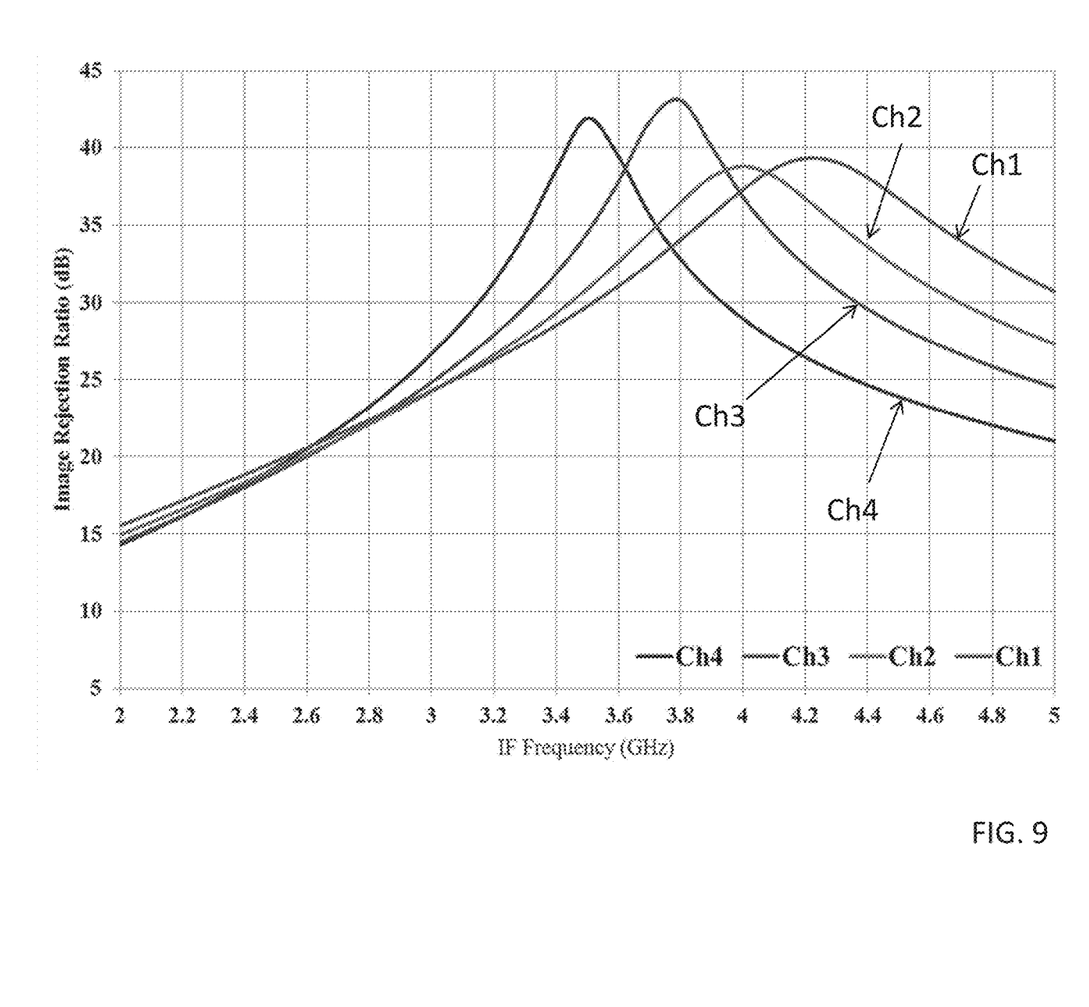
FIG. 9 is a plot showing a calculated image rejection in the electronic apparatus of FIG. 6.

The simulated conversion gain of this mixer among the four channels is shown in FIG. 7. Their average 3 dB is around 3 GHz. The conversion loss of the image and the calculated image rejections are shown in FIGS. 8 and 9 respectively. In these results, it is shown that the mixer in accordance with an embodiment of the invention may suppress the image by more than 30 dB.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. An electronic apparatus for use in a communication system comprising:
    a switching module arranged to combine a plurality of input signals received by a plurality of input ports in connection with the switching module to define a combined input signal having a plurality of frequency components; and
    a loading module arranged to receive the combined input signal from the switching module and to individually separate each of the plurality of frequency components of the combined input signal by processing the combined input signal with a plurality of resonating networks, each arranged to resonate at a resonance frequency associated with each of the plurality of frequency components of the combined input signals, wherein the loading module is arranged to output an output signal having a desired frequency component separated from the plurality of frequency components separated of the combined input signal to an output port in connection with the loading module, and the plurality of frequency components further include an image frequency component.

2. An electronic apparatus in accordance with claim 1, wherein the loading module is further arranged to suppress the image frequency component from reaching the output port.

3. An electronic apparatus in accordance with claim 1, wherein the plurality of resonating networks includes an inductor-capacitor network.

4. An electronic apparatus for use in a communication system comprising:
    a switching module arranged to combine a plurality of input signals received by a plurality of input ports in connection with the switching module to define a combined input signal having a plurality of frequency components; and
    a loading module arranged to receive the combined input signal from the switching module and to individually separate each of the plurality of frequency components of the combined input signal by processing the combined input signal with a plurality of resonating networks, each arranged to resonate at a resonance frequency associated with each of the plurality of frequency components of the combined input signals;
wherein the loading module is arranged to output an output signal having a desired frequency component separated from the plurality of frequency components separated of the combined input signal to an output port in connection with the loading module, wherein the plurality of resonating networks comprise a first resonator and a second resonator, wherein the first resonator comprises a first inductor connected to a first capacitor, and the second resonator includes a second inductor connected to a second capacitor, and wherein the first resonator is arranged to pass the image frequency component to a ground.

5. An electronic apparatus in accordance with claim 4, wherein the first resonator is arranged to resonate at a first resonance frequency associated with the image frequency component.

6. An electronic apparatus in accordance with claim 5, wherein the first resonance frequency is represented by $$\omega_{stop}^2 = \frac{1}{L_1 C_1},$$

wherein $\omega_{stop}$ is the first resonance frequency, $L_1$ is a first inductance value of the first inductor, and $C_1$ is a first capacitance value of the first capacitor.

7. An electronic apparatus in accordance with claim 6, wherein the first inductor and the first capacitor are connected in series.

8. An electronic apparatus in accordance with claim 6, wherein the second resonator is arranged to pass the desired frequency component to the output port.

9. An electronic apparatus in accordance with claim 8, wherein the second resonator is arranged to resonate at a second resonance frequency associated with the desired frequency component.

10. An electronic apparatus in accordance with claim 9, wherein the second resonance frequency is represented by $$\omega_{pass}^2 = \frac{(C_1 + C_2)L_2 + L_1 C_1 - 1}{L_1 L_2 C_1 C_2},$$

wherein $\omega_{pass}$ is the second resonance frequency, $L_1$ is the first inductance value of the first inductor, $C_1$ is the first capacitance value of the first capacitor, $L_2$ is a second inductance value of the second inductor, and $C_2$ is a second capacitance value of the second capacitor.

11. An electronic apparatus in accordance with claim 10, wherein the second inductor and the second capacitor are connected in parallel.

12. An electronic apparatus for use in a communication system comprising:
a switching module arranged to combine a plurality of input signals received by a plurality of input ports in connection with the switching module to define a combined input signal having a plurality of frequency components; and
a loading module arranged to receive the combined input signal from the switching module and to individually separate each of the plurality of frequency components of the combined input signal by processing the combined input signal with a plurality of resonating networks, each arranged to resonate at a resonance frequency associated with each of the plurality of frequency components of the combined input signals, wherein the loading module is arranged to output an output signal having a desired frequency component separated from the plurality of frequency components separated of the combined input signal to an output port in connection with the loading module, wherein the plurality of resonating networks include a first resonator and a second resonator, wherein the first resonator includes a first inductor connected to a first capacitor, and the second resonator includes a second inductor connected to a second capacitor, and wherein the loading module is a transformer based load.

13. An electronic apparatus in accordance with claim 12, wherein the first inductor is approximate to the second inductor.

14. An electronic apparatus in accordance with claim 13, wherein the first inductor and the second inductor are magnetically coupled.

15. An electronic apparatus in accordance with claim 12, wherein the first capacitor and the second capacitor are controllable capacitors.

16. An electronic apparatus in accordance with claim 15, wherein the controllable capacitors are digitally controllable.

17. An electronic apparatus in accordance with claim 15, wherein the controllable capacitors are arranged to alter the resonance frequencies of the loading module such that the electronic apparatus is arranged to operate within a bandwidth in a frequency domain.

18. An electronic apparatus for use in a communication system comprising:
a switching module arranged to combine a plurality of input signals received by a plurality of input ports in connection with the switching module to define a combined input signal having a plurality of frequency components;
a loading module arranged to receive the combined input signal from the switching module and to individually separate each of the plurality of frequency components of the combined input signal by processing the combined input signal with a plurality of resonating networks, each arranged to resonate at a resonance frequency associated with each of the plurality of frequency components of the combined input signals
an input buffer connected to at least one of the plurality of input ports; and
an output buffer connected to the output port, wherein the loading module is arranged to output an output signal having a desired frequency component separated from the plurality of frequency components separated of the combined input signal to an output port in connection with the loading module.

19. An electronic apparatus in accordance with claim 18, wherein the input buffer is arranged to perform a low to high impedance transformation to at least one of the plurality of input signals received at the plurality of input ports.

20. An electronic apparatus in accordance with claim 18, wherein the output buffer is arranged to perform a high to low impedance transformation to the output signal.

21. An electronic apparatus for use in a communication system comprising:
a switching module arranged to combine a plurality of input signals received by a plurality of input ports in connection with the switching module to define a combined input signal having a plurality of frequency components; and
a loading module arranged to receive the combined input signal from the switching module and to individually separate each of the plurality of frequency components of the combined input signal by processing the combined input signal with a plurality of resonating networks, each arranged to resonate at a resonance frequency associated with each of the plurality of frequency components of the combined input signals, wherein the loading module is arranged to output an output signal having a desired frequency component separated from the plurality of frequency components separated of the combined input signal to an output port in connection with the loading module, and, wherein the plurality of input signals include at least one of an intermediate frequency signal and a local oscillator signal; and wherein the output signal includes a radio frequency signal.

22. An electronic apparatus in accordance with claim 21, wherein the electronic apparatus is a communication signal mixer.

23. An electronic apparatus in accordance with claim 22, wherein the switching module and/or the loading module is implemented with integrated-circuit process.

* * * * *